United States Patent [19]

Rasche

[11] Patent Number: 5,677,627

[45] Date of Patent: Oct. 14, 1997

[54] MULTISLICE MR METHOD

[75] Inventor: Volker Rasche, Hamburg, Germany

[73] Assignee: U.S. Philips Corporation, New York, N.Y.

[21] Appl. No.: 539,136

[22] Filed: Oct. 4, 1995

[30] Foreign Application Priority Data

Oct. 4, 1994 [DE] Germany .................. 44 35 464.9

[51] Int. Cl.$^6$ .................................................. G01R 33/54
[52] U.S. Cl. ........................................................ 324/309
[58] Field of Search .................................... 324/300, 307, 324/309, 318, 316; 128/653.2, 653.3, 653.5

[56] References Cited

U.S. PATENT DOCUMENTS

| | | |
|---|---|---|
| 4,727,325 | 2/1988 | Matsui et al. .................. 324/309 |
| 4,843,322 | 6/1989 | Glover ........................... 324/309 |
| 4,999,580 | 3/1991 | Meyer et al. ................... 324/309 |
| 5,298,862 | 3/1994 | Henning ........................ 324/309 |
| 5,386,190 | 1/1995 | Takeuchi et al. ............... 324/309 |
| 5,422,572 | 6/1995 | Yao ............................... 324/309 |

*Primary Examiner*—Sandra L. O'Shea
*Assistant Examiner*—Roger C. Phillips
*Attorney, Agent, or Firm*—Jack D. Slobod

[57] ABSTRACT

A magnetic resonance (MR) multislice method, in which in each cycle nuclear magnetization is successively excited in a respective group of measuring slices which are situated at a distance from one another and the MR signals generated under the influence of at least one gradient magnetic field are acquired, is such that the groups of measuring slices excited in different cycles exhibit a spatial offset relative to one another which is smaller than the distance between the measuring slices excited in a cycle and the gradient magnetic fields are varied from one cycle to another. The nuclear magnetization distribution in a reconstruction slice is reconstructed from the MR signals acquired in the various cycles and originating from measuring slices which neighbour one another in space and are situated to both sides of the reconstruction slice. In such a multislice method, reconstruction is improved in that the direction of the gradient of the gradient magnetic field active during the acquisition of the MR signal is varied from one cycle to another in such a manner that the directions occurring in all cycles together are distributed over an angular range of 360°, the directional differences being greater as the offset between the groups of measuring slices associated with the cycles is greater. Further the MR signals from measuring slices situated at a small distance from the reconstruction slice enter the reconstruction with a weighting factor which is higher than that of the MR signals from measuring slices situated at a greater distance from the reconstruction slice.

4 Claims, 4 Drawing Sheets

MULTISLICE MR METHOD

BACKGROUND OF THE INVENTION

1. Field of the Invention

The invention relates to an MR method, in which during each cycle nuclear magnetization is successively excited in a respective group of measuring slices which are situated at a distance from one another and the MR signals generated under the influence of at least one gradient magnetic field are acquired, in which the groups of measuring slices excited in different cycles exhibit a spatial offset relative to one another which is smaller than the distance between the measuring slices excited in a cycle, in which the gradient magnetic fields are varied from one cycle to another, and in which the nuclear magnetization distribution in a reconstruction slice is reconstructed from the MR signals acquired in the various cycles and originating from measuring slices which neighbor one another in space and are situated to both sides of the reconstruction slice.

and also relates to a device for carrying out this method.

2. Description of the Related Art

Multislice MR methods offer the advantage that the MR data of a number of parallel slices can be acquired practically in the same period of time as required for the acquisition of the MR data of a single slice. The slices successively excited within a cycle must then be situated at a distance from one another so as to avoid recurrent excitation of the nuclear magnetization in a slice within one cycle. This is the reason why in conventional multislice MR methods the nuclear magnetization distribution cannot be reconstructed in the gaps between the slices.

This drawback is avoided by the MR method set forth which is known from DE-PS 41 37 270, which corresponds to U.S. Pat. No. 5,298,862. This is because therein from one cycle to another groups of measuring slices are excited, which are slightly offset relative to one another, the offset corresponding to the distance between two measuring slices within a group, divided by the number of cycles. The reconstruction of the nuclear magnetization in a slice, referred to as the reconstruction slice, therefore, is performed by means of MR signals derived from slices excited in different cycles and slightly offset in space relative to one another; in other words, the nuclear magnetization distribution in the reconstruction slice corresponds to the mean value of the nuclear magnetization distribution in the measuring slices which are slightly offset in space and overlap one another.

In the known method the gradient magnetic field, being the so-called phase encoding gradient which is active between the excitation of the nuclear magnetization in a measuring slice and the acquisition of the MR signal from this measuring slice, is varied from one cycle to another. According to this so-called 2DF method, the MR signal is known to be smaller as the phase encoding gradient is larger, because only fine structures in the slice then contribute to the MR signal. Therefore, the measuring slice which has been measured with a phase encoding gradient equal to zero makes the largest contribution to the nuclear magnetization distribution determined for a reconstruction slice, irrespective of whether this measuring slice has the same position as the reconstruction slice or whether it is offset one half slice thickness with respect thereto. This leads to undesirable image renditions.

SUMMARY OF THE INVENTION

It is an object of the present invention to improve a method of the kind set forth in this respect. This object is achieved in accordance with the invention in that the direction of the gradient of the gradient magnetic field active during the acquisition of the MR signal is varied from one cycle to another in such a manner that the directions occurring in all cycles together are distributed over an angular range of 360°, the directional difference being greater as the offset between the groups of measuring slices associated with the cycles is greater, and that the MR signals from measuring slices situated at a small distance from the reconstruction slice enter the reconstruction with a weighting factor which is greater than that of the MR signals from measuring slices situated at a greater distance from the reconstruction slice.

Instead of the 2DF method, the invention utilizes the so-called projection-reconstruction method in which no phase encoding gradient whatsoever is applied after excitation of the nuclear magnetization, but only a read gradient whose direction is changed from one cycle to another. According to this method, during the acquisition of each MR signal a path is followed in the so-called k-space, which path also reaches its zero point associated with the low spatial frequencies, i.e. the large image structures within the slice. As a result, unlike in 2DF methods, all MR signals also contain information as regards the large structures in the examination zone and hence have (initially) the same weight.

Because the MR signals, or the projection data which are derived therefrom by inverse Fourier transformation and which correspond to the spectrum of the MR signal, are thus weighted in conformity with the distance between the reconstruction slice and the measuring slice wherefrom the projection data originate, it is achieved that the measuring slice whose position corresponds best to that of the reconstruction slice is weighted more than measuring slices whose center is situated at the edge of the reconstruction slice. Even though the nuclear magnetization distribution in the reconstruction slice is thus derived from signals or data acquired from measuring slices which are slightly mutually offset in space, the nuclear magnetization distribution thus reconstructed accurately corresponds to that which would have been obtained in a measuring slice occupying this position.

In a preferred version of the invention, the weighting factors are chosen so that their sum is at least substantially constant for MR signals acquired with directions of the gradient magnetic field which deviate at least approximately 180° from one another. In conjunction with the distribution of the gradient directions over the measuring slices in accordance with the invention, this version avoids the occurrence of streak-like artefacts which can occur in principle in the projection-reconstruction method whenever individual directions are emphasized relative to other directions.

It is to be noted that from a publication by Rasche et al; "Improved Mecquisition and Reconstruction schemes in Helical Imaging", Proceedings, SMR 2nd Meeting, page 787 (1994), it is known to weight the MR signals, or the projection data derived therefrom, for the various gradient directions. However, this does not concern a multislice method, but a tomography method in which a single, spatially defined but temporally changing (for example, due to an inflowing contrast medium) slice is examined.

A device for carrying out the method, comprising an RF coil system for generating magnetic RF pulses in order to excite the nuclear magnetization in various slices of the examination zone as well as for receiving the MR signals subsequently occurring, a frequency-controllable oscillator device which determines the centre frequency of the RF pulses, a gradient coil system for generating gradient magnetic fields during the RF pulses as well as during the acquisition of the MR signals, a reconstruction unit for reconstructing the nuclear magnetization distribution in a reconstruction slice having a presettable position from the MR signals, and a programmable control unit for controlling the temporal variation of the RF pulses and the gradient magnetic fields, in accordance with the invention is characterized by the control unit programmed in such manner that.

a) that during each cycle for each measuring slice there is generated at least one RF pulse having a centre frequency which is varied in steps of a first magnitude from one measuring slice to another, the MR signals being acquired from the measuring slices with a gradient of the gradient magnetic field extending in the same direction.

b) that from one cycle to another the centre frequencies of the RF pulses are offset relative to one another in steps of a magnitude which is small in comparison with the first magnitude, the direction of the gradient active during the acquisition of the MR signals being varied in such a manner that the directions occurring during all cycles together are distributed over an angular range of 360°, and c) that the reconstruction unit is constructed so that the MR signals from measuring slices situated at a small distance from the reconstruction slice enter the reconstruction with a weighting factor which is higher than that of the MR signals from measuring slices situated at a greater distance from the reconstruction slice.

The invention will be described in detail hereinafter with reference to the drawings. Therein:

FIG. 1 shows a magnetic resonance tomography apparatus suitable for carrying out the invention, FIG. 2 shows a block diagram of such an apparatus, FIG. 3 shows the temporal variation of various signals of two sequences associated with different excitation cycles, FIG. 4 shows the position in space of the measuring slices for different cycles, FIG. 5 shows the spatial assignment of the projection data derived from the MR signals to the examination zone, FIG. 6 shows the scanning of the k-space in the method of the invention, FIG. 7 shows the gradient direction α as a function of the position of the measuring slices, and FIG. 8 shows the associated variation of the weighting factors.

DETAILED DESCRIPTION OF THE PREFERRED EMBODIMENT

Figure 1:
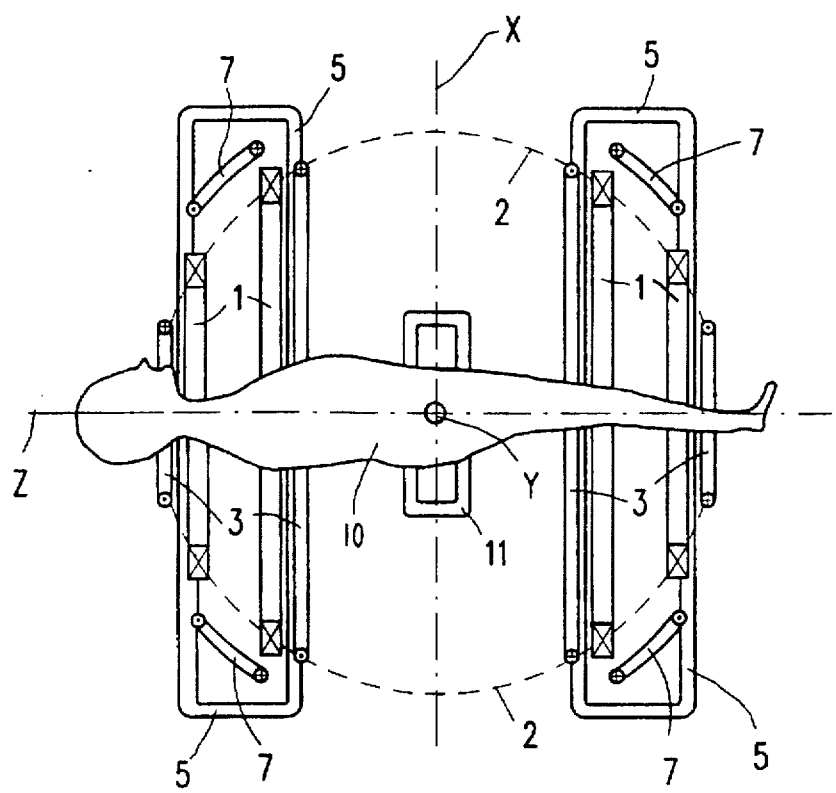

The MR apparatus which is diagrammatically shown in FIG. 1 comprises a device for generating a uniform, steady magnetic field which consists of four coils forming $G_z$ gradient coil subsystem 1, the intensity of said magnetic field being of the order of magnitude of from some tenths of tesla to some tesla. The patient 10 to be examined is arranged on a table (FIG. 2) within these coils.

Four coils forming $G_z$ coil subsystem 3 are arranged on the surface 2 of a sphere in order to generate a magnetic field $G_z$ which extends in the z direction and which linearly varies in this direction. Also provided are four coils 7 forming $G_x$ coil subsystem in order to generate a magnetic field $G_x$ which also extends in the z direction but which varies linearly in the x direction (vertically). A magnetic field $G_y$ which extends in the z direction and which varies linearly in the y direction (perpendicularly to the plane of drawing of FIG. 1) is generated by four coils forming $G_y$ gradient coil subsystem 5 which may be identical to the coils forming $G_x$ gradient coil subsystem 7 but which are arranged so as to be offset 90° with respect thereto, only two of said coils 5 being visible. The magnetic fields generated by the system of gradient coils will also be referred to hereinafter as "gradient magnetic fields" or simply as "gradient". Because each of the three coil subsystems 3, 5 and 7 for generating the gradient magnetic fields is symmetrically arranged relative to the spherical surface 2, the field strength at the center of the sphere is determined exclusively by the steady, uniform magnetic field of the main field coil system 1.

There is also provided an RF coil 11 which generates an essentially uniform RF magnetic field which extends perpendicularly to the direction of the steady, uniform magnetic field (i.e. perpendicularly to the z direction). As appears from FIG. 2, the RF coil 11 can be connected at option, via a switch 8, to an oscillator 6 or to a receiver 9.

In the switch position shown, the RF coil 11 can be used to receive the MR signals generated in the examination zone. However, for the reception of the MR signals use can alternatively be made of a separate RF receiving coil which is not shown in FIG. 1.

The temporal position of the RF pulses, their bandwidth and their center frequency can be controlled by a control unit 12 which also controls the current through the coils 1 as well as the temporal variation of the magnetic gradient fields $G_x$, $G_y$ and $G_z$. There is also provided a reconstruction unit 13 which is capable of reconstructing from the MR signals the nuclear magnetization distribution in a slice which will be referred to hereinafter as the "reconstruction slice", or in several of such slices, for reproduction via an output unit 14.

Figure 3:
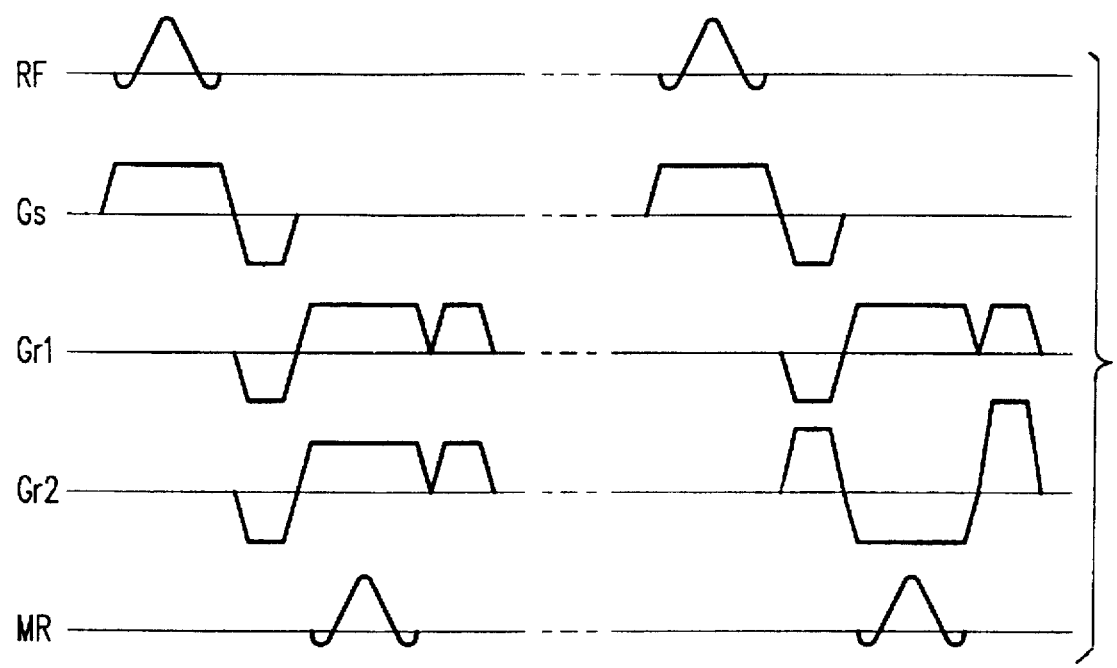

The left half and the right half of FIG. 3 show the position and the temporal variation of various signals in two sequences of the invention which are active during different excitation cycles. The first line shows the position and the temporal variation of the envelope of the RF pulse RF. The second to fourth lines show the variation of three magnetic gradient fields; the second line shows the variation of a gradient field $G_s$ which is active during the RF pulse RF and which may extend, for example in the z direction ($G_s=G_z$), whereas the third and fourth lines show the variation of two magnetic gradient fields which are active during the acquisition of the MR signal (shown on the fifth line) and which are, therefore, referred to as "read gradients" $G_{r1}$ and $G_{r2}$.

The gradient $G_s$ active during the pulse RF ensures that the nuclear magnetization is excited exclusively in a given slice (for distinction this slice will be referred to hereinafter as "measuring slice", whereas a slice in which subsequently the nuclear magnetization distribution is reconstructed will be referred to as "reconstruction slice") whose position is dependent on the centre frequency of the RF pulse. The MR signal thus produced is acquired during the second of three segments constituting the read gradients $G_{r1}$, $G_{r2}$ which extend perpendicularly to the gradient $G_s=G_z$; for example, $G_{r1}=G_x$ and $G_{r2}=G_y$. The first segment of the read gradients $G_{r1}$ and $G_{r2}$ has a polarity which opposes that of the second segment and the time integral thereover amounts to only half the time integral over the second segment. It is thus achieved that upon acquisition of the MR signal in the k-space a straight path is followed which passes through the zero point of the k-space in the centre of the second segment, with the result that the MR signal reaches a maximum value at this instant. The third segment, succeeding the second segment, is proportioned so that the time integral over all three segments of the relevant read gradient is always constant.

The sequence shown at the left of FIG. 3 is repeated in conformity with the number of slices to be excited in the relevant cycle, i.e. for s slices to be excited s sequences are generated per cycle. From one repeat to another, merely the centre frequency of the pulse RF supplied by the oscillator 6 is varied in steps of magnitude df, where df must be larger than the bandwidth of the pulse RF. It is thus achieved that the slices excited within a cycle are offset relative to one another and do not overlap one another. This is necessary to ensure that the nuclear magnetization of a slice is excited by a single sequence only during a cycle.

The subsequent cycles deviate from the respective preceding cycle in two respects:

a) From one cycle to another the center frequencies of the RF pulses are varied by an amount $\Delta f$, where $\Delta f = dr/N$, N being the number of cycles. The frequency spacing df between the centre frequencies of the RF pulses, however, remains the same.

b) From one cycle to another, the direction of the read gradient is also varied. This takes place by variation of the magnitude and/or polarity of at least one of the two gradients $G_{r1}$ or $G_{r2}$ during the second segment (and hence also during the first segment); this results in a directional variation, because $G_{r1}$ and $G_{r2}$ extend perpendicularly to one another. When the nuclear magnetization distribution is to be reconstructed from NMR signals, the directional variation should mount to $360°/N$.

The direction of the read gradients $G_{r1}$, $G_{r2}$ and the frequency variation, or the resultant spatial offset of the excited measuring slices through dz/N, should be associated with one another in such a manner that as the offset of the measuring slices increases, the directional variation of the read gradient increases or decreases monotonously.

Figure 4:
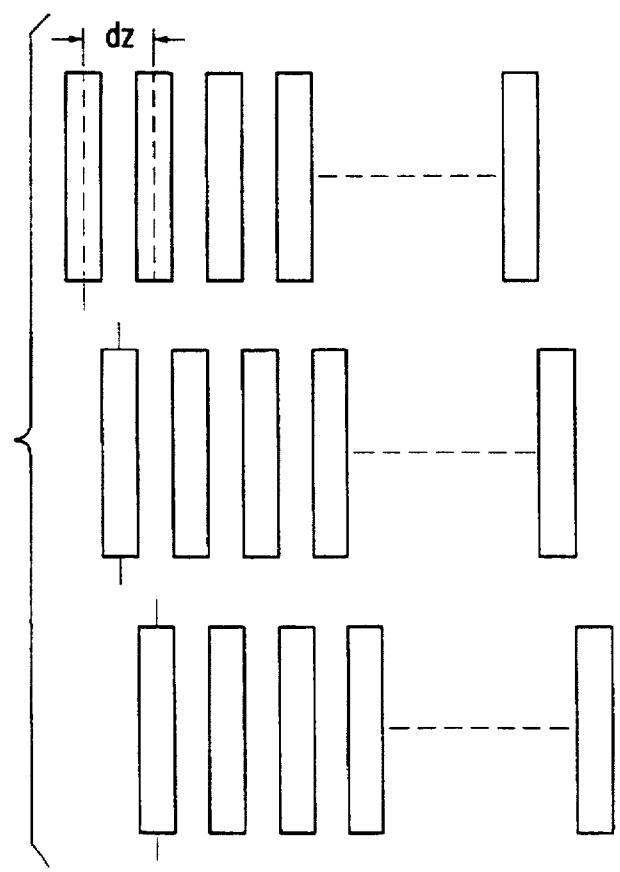

For three different cycles, FIG. 4 shows the position of the slices whose nuclear magnetization is successively excited. The first row represents this position during a first cycle, whereas the second row represents the situation after approximately n/2 cycles, and the last row represents the situation in the $n^{th}$ cycle, i.e. in the last cycle. The distance between two neighboring slices excited within one cycle, i.e. the distance between their central planes, mounts to dz. This holds for all cycles. From one cycle to another, however, all slices are offset by the mount dz/N relative to their previous position, so that after half the number of cycles the first slice of the excited group of slices is situated in a position approximately halfway between the first and the second slice during the first cycle. In the last cycle, the first slice of the group has substantially reached the position occupied by the second slice during the first cycle.

Figure 6:
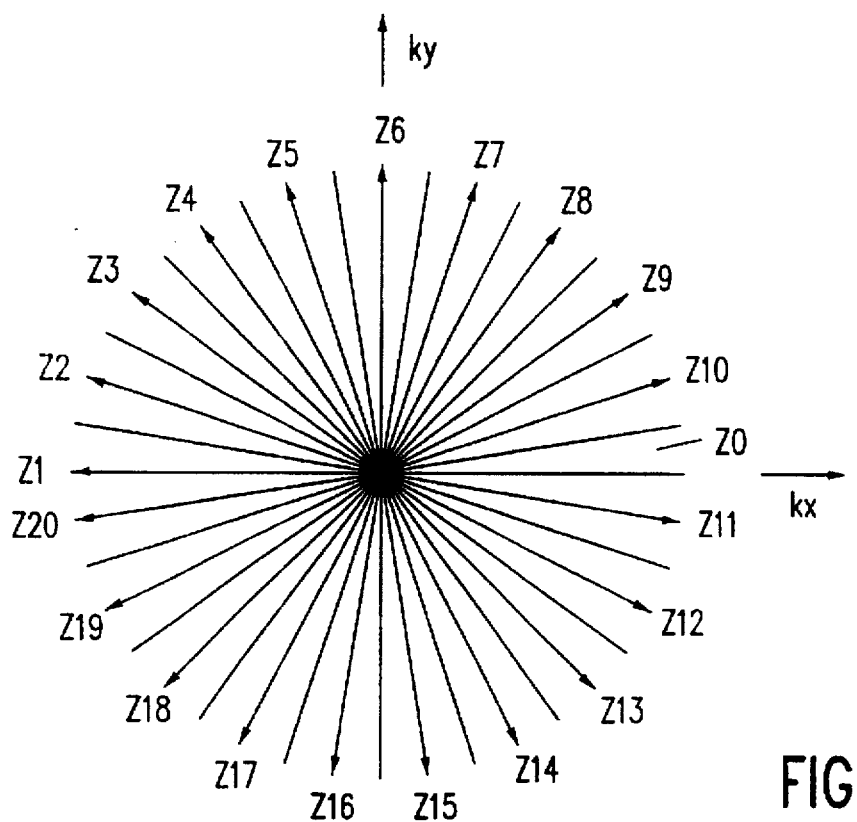

FIG. 6 illustrates the scanning of the k-space during the various cycles (as is known, the k-value of a single sampling value of an MR signal corresponds to the time integral over the gradient magnetic fields from the excitation until the acquisition of the relevant sampling value). Each MR signal is acquired along a path which corresponds to a straight line through the zero point of the k-space. If, as assumed in FIG. 3, the time integral over the first segment of the read gradient $G_{r1}$ or $G_{r2}$ mounts to half the time integral over the second segment thereof, the ends of these lines will be situated at the same distance from the zero point, so that the pattern shown is obtained. An arrow indicates the direction in which the k-space is traversed. Thus, N lines through the zero point of the k-space, occur, N being equal to 20 in FIG. 6.

Each line is provided with a designation $z1 \ldots z20$ which characterizes the position in space of one of the measuring slices excited by a cycle, for example the position of the first measuring slice. It holds that $zi$ ($i=1 \ldots 20$) is larger as i is larger. It appears that during the first ten cycles ($=N/2$) the direction of the lines in the k-space (and hence the direction of the read gradient in the space) changes $360°/N$ from one cycle to another, so that with respect to the line for the first cycle (z1) the line (z10) for the tenth cycle has been rotated through $180°-360°/N$ and for the next cycle (z11) by $180°+360°/2N$. For the subsequent cycles, the angular increment $360°/N$ occurs again. The k-space is thus uniformly scanned for an even number of N cycles (in the case of an odd number, uniform scanning is obtained in an even simpler manner by way of an angular increment $360°/N$ from one cycle to another).

Figure 7:
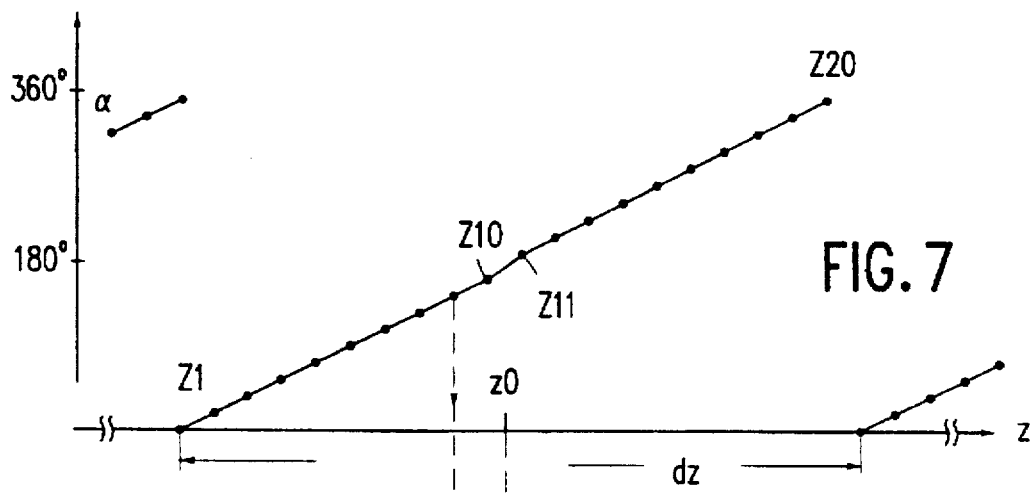

FIG. 7 shows the resultant association of the direction $\alpha$ of the read gradient with the position z of a given measuring slice (for example, the second slice). This association is partly recognized also for the two neighboring slices.

For the reconstruction of the nuclear magnetization distribution in a reconstruction slice situated at z0, the projection data of each time $N/2$ ($=10$) spatially successive measuring slices, situation to both sides of z0 and acquired during different cycles, are taken into account. The reconstruction on the basis of the data acquired in this manner is performed as follows in the reconstruction unit 13 (FIG. 2).

Each MR signal, which has been transposed to the low-frequency range and digitized in the receiver 9 and which is present on the receiver output as a series of digital sampling values, is subjected to an inverse Fourier transformation in block 131. The projection data $P(\alpha)$ thus produced are multiplied in block 133 by a weighting factor $W(z)$ fetched from a memory 132. The projection data thus weighted are subjected to a backprojection in block 134, as is customary for X-ray computer tomography, which backprojection yields an image of the nuclear magnetization distribution in the reconstruction slice.

Figure 2:
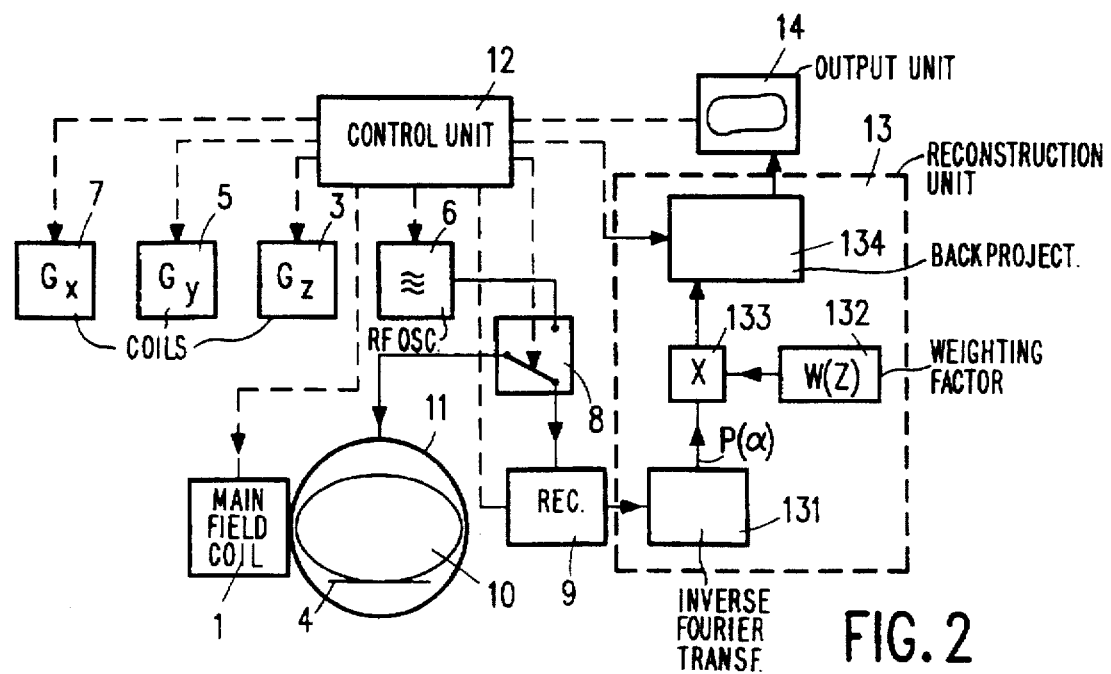

The blocks 131 ... 134 are shown as a hardware configuration in FIG. 2, but to those skilled in the art it will be evident that the reconstruction unit can also be implemented as a programmable processor system which processes the MR data in the manner disclosed with reference to the blocks 131 ... 134.

Figure 5:
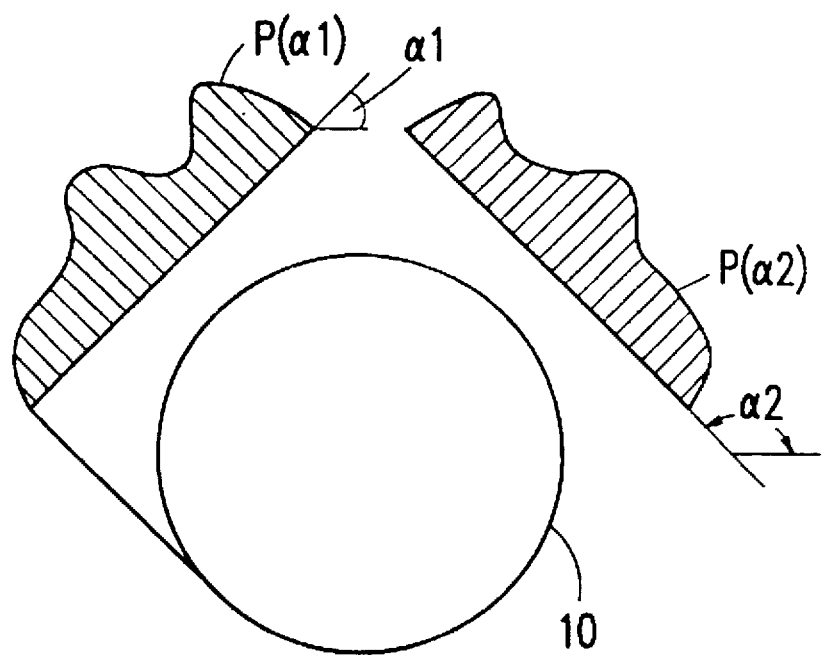

The projection data produced by the Fourier transformation in block 131 correspond to the spectrum of the MR signal or a projection $P(\alpha)$ of the nuclear magnetization distribution in the direction a of the read gradient. $P(\alpha)$ thus corresponds to the line integral of the nuclear magnetization distribution along straight lines extending in the direction $\alpha$. FIG. 5 shows the projection data $P(\alpha 1)$ and $P(\alpha 2)$ acquired from a slice for two different gradient directions $\alpha 1$ and $\alpha 2$. These projection data deviate for different directions $\alpha 1$ and $\alpha 2$, but the integral over the projection data perpendicular to the direction $\alpha$ (i.e. the shaded area in FIG. 5) is the same in all directions in a given object.

Figure 8:
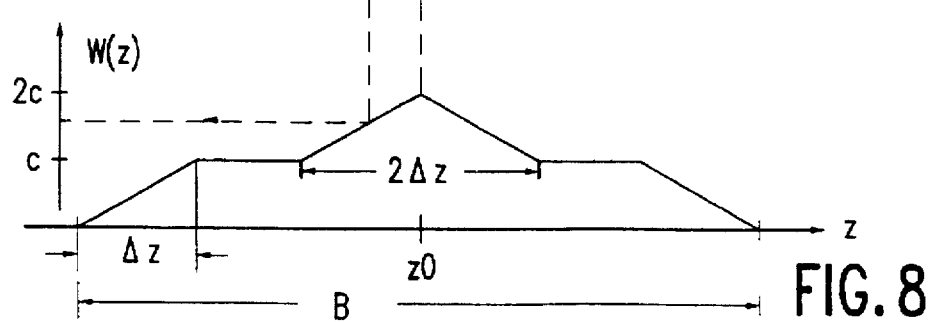

The projection dam $P(\alpha)$ for a given angle a of the read gradient (or from a given cycle), characterized by a respective point in the diagram of FIG. 7, are multiplied by the weighting factor from the weighting factor curve $W(z)$ of FIG. 8 which is given therebelow in the form of dashed lines. The weighting factor curve is defined in an area B (other than zero) which corresponds to the distance dz between two neighboring measuring slices excited within one measuring cycle. Wz has a maximum $2c$, for the value z0 of the reconstruction slice, where c is a constant, for example 1. In a zone $\Delta z$ to both sides of this maximum, the weighting factor varies linearly to a value c. The weighting factor then remains constant ($=c$) until a distance $\Delta z$ from the edges of the definition zone is reached. Beyond that it linearly decreases to zero.

In the position of z0 shown in the FIGS. 6 and 7, the projection data of the measuring slices z10 and z11 enter the backprojection with a weighting factor of substantially 2c, whereas the projection data of the measuring slices z1 and z20 situated near the edges of the definition zone B enter the backprojection with a weighting factor which is almost zero. Because the more remote slices z1 and z20 contribute substantially less to the reconstruction than the directly neighbouring measuring slices z1 and z11, an image of higher definition is obtained.

It is important in this respect that because of the described variation of the weighting factor curve V(z) it is ensured that the sum of the weighting factors for two 180° offset slices is a constant. For example, the sum of the weighting factors for the measuring slices z1 and z11, measured by means of a read gradient offset approximately 180° with respect to one another, is exactly equal to the sum of the weighting factors of the measuring slices z6 and z16 which were also measured with approximately 180° offset directions of the read gradient. Therefore, all directions enter the reconstruction with the same weight (the projection data of a measuring slice for 180° offset read gradients are identical), thus avoiding the streak-like artefacts which could occur in the case of different, direction-dependent weighting of the projection data during the reconstruction.

In the version shown in FIG. 7, the position z0 of the reconstruction slice happens to coincide exactly with the center of the zone in which the position of a given measuring slice is shifted from one cycle to another. If this condition is not satisfied, the weighting factor curve (FIG. 8) is shifted in conformity with z0 and the data situated above the shifted curve W(z) in FIG. 7 are used for the reconstruction.

For the sequences shown in FIG. 3 it was assumed that the second segment of the read gradient, during which the MR signal is acquired, is preceded by a first segment whose time integral mounts to half of that of the second segment. However, this first gradient segment may also be dispensed with. This offers the advantage that the distance in time between the excitation of a slice and the acquisition of the MR signal can be reduced, so that this method is suitable for an examination zone with a comparatively inhomogeneous steady main magnetic field. Because each time only a radius emanating from the zero point is then scanned in the k-space, the number of cycles must be doubled if the same spatial resolution is to be achieved as in a method in which the zero point of the k-space is situated halfway the straight line which is twice as long. Two radii which have been shifted through 180° relative to one another then correspond to a single straight line as shown in FIG. 6. These two mutually opposed directions should be covered, if possible, in directly successive cycles, either the same group of measuring slices being excited in the both cycles, i.e. without spatial offset, or a group of measuring slices which has been offset only dz/2N with respect thereto.

I claim:

1. An MR method comprising a number of cycles in which in each cycle the nuclear magnetization is successively excited in a plurality of measuring slices which are situated at a distance from one another and which form a respective group and the MR signals generated under the influence of at least one gradient magnetic field are acquired, in which the groups of measuring slices excited in different cycles exhibit a spatial offset relative to one another which is smaller than the distance between the measuring slices excited in a cycle, in which the gradient magnetic fields are varied from one cycle to another, and in which the nuclear magnetization distribution in a reconstruction slice is reconstructed from the MR signals acquired in the various cycles and originating from measuring slices which neighbor one another in space and are situated to both sides of the reconstruction slice, characterized in that:

a) the direction ($\alpha$) of the gradient of the gradient magnetic field ($G_{r1}$, $G_{r2}$) active during the acquisition of the MR signal is varied from one cycle to another in such a manner that the directions ($\alpha$) occurring in all cycles together are distributed over an angular range of 360°, the directional difference being greater as the offset between the groups of measuring slices associated with the cycles is greater, and b) the MR signals, or the projection data (P($\alpha$)) derived therefrom, from measuring slices ($z_{10}$, $z_{11}$) situated at a small distance from the reconstruction slice enter the reconstruction with a weighting factor (W(z)) which is higher than that of the MR signals, or projection data, from measuring slices ($z_1$, $z_{20}$) situated at a greater distance from the reconstruction slice ($z_0$).

2. An MR method as claimed in claim 1, characterized in that the weighting factors (W(z)) are chosen so that their sum is at least substantially constant for MR signals (for example, $z_1$, $z_{11}$) acquired with directions of the gradient magnetic field which deviate at least approximately 180° from one another.

3. An MR device, comprising an RF coil system for generating magnetic RF pulses in order to excite nuclear magnetization in various slices of the examination zone as well as for receiving the MR signals subsequently occurring, a frequency-controllable oscillator device which determines the center frequency of the RF pulses, a gradient coil system for generating gradient magnetic fields ($G_r$, $G_{r1}$, $G_{r2}$) during the RF pulses as well as during the acquisition of the MR signals, a reconstruction unit for reconstructing the nuclear magnetization distribution in a reconstruction slice having a presettable position ($z_0$) from the MR signals, and a programmable control unit for controlling the temporal variation of the RF pulses and the gradient magnetic fields, characterized in that the control unit (12) is programmed in such a manner that a) during each cycle for each measuring slice there is generated at least one RF pulse (RF) having a centre frequency which is varied in steps (df) of a first magnitude from one measuring slice to another, the MR signals being acquired from the measuring slices with a gradient of the gradient magnetic field extending in the same direction ($\alpha$), b) from one cycle to another the center frequencies of the RF pulses are offset relative to one another in steps ($\Delta$) of a magnitude which is small in comparison with the first magnitude, the direction ($\alpha$) of the gradient active during the acquisition of the MR signals being varied in such a manner that the directions occurring during all cycles together are distributed over an angular range of 360°, and c) the reconstruction unit is constructed so that the MR signals, or the projection data (P($\alpha$)), from measuring slices situated at a small distance from the reconstruction slice enter the reconstruction with a weighting factor (W(z)) which is higher than that of the MR signals from measuring slices situated at a greater distance from the reconstruction slice.

4. An MR device as claim 3, characterized in that the weighting factors (W(z)) are chosen so that their sum is at least substantially constant for MR signals (for example, $z_1$, $z_{11}$) acquired with directions of the gradient magnetic field which deviate at least approximately 180° for one another.

* * * * *